United States Patent [19]
Darrel et al.

[11] 4,159,446
[45] Jun. 26, 1979

[54] ACOUSTIC DIAGNOSTIC SYSTEM FOR CONTACTS IN POWER DISTRIBUTION SYSTEMS

[75] Inventors: Bernard Darrel, Schenectady, N.Y.; Richard Blackburn, Conover, N.C.

[73] Assignee: General Electric Company, Schenectady, N.Y.

[21] Appl. No.: 879,351

[22] Filed: Feb. 21, 1978

[51] Int. Cl.² .............................................. G01R 31/02
[52] U.S. Cl. .............................. 324/28 R; 324/28 CB
[58] Field of Search ........... 324/28 R, 28 CH, 28 CB, 324/28 CR, 80

[56] References Cited
U.S. PATENT DOCUMENTS

| | | |
|---|---|---|
| 3,495,174 | 2/1970 | Marek ................................ 324/28 R |
| 3,612,985 | 10/1971 | Rockett ............................. 324/28 R |
| 3,947,758 | 3/1976 | Sutton .............................. 324/28 R |

Primary Examiner—M. Tokar
Attorney, Agent, or Firm—Lawrence D. Cutter; Joseph T. Cohen; Marvin Snyder

[57] ABSTRACT

An acoustic diagnostic system for detecting misalignment of switch blade contacts in power distribution systems is disclosed. In accordance with one embodiment of the present invention, the high frequency component of the acoustic signal generated by the make and break of electrical contacts in high energy power distribution equipment is filtered and demodulated to produce a waveform from which significant timing information is provided. A method for producing these waveforms is also disclosed.

12 Claims, 10 Drawing Figures

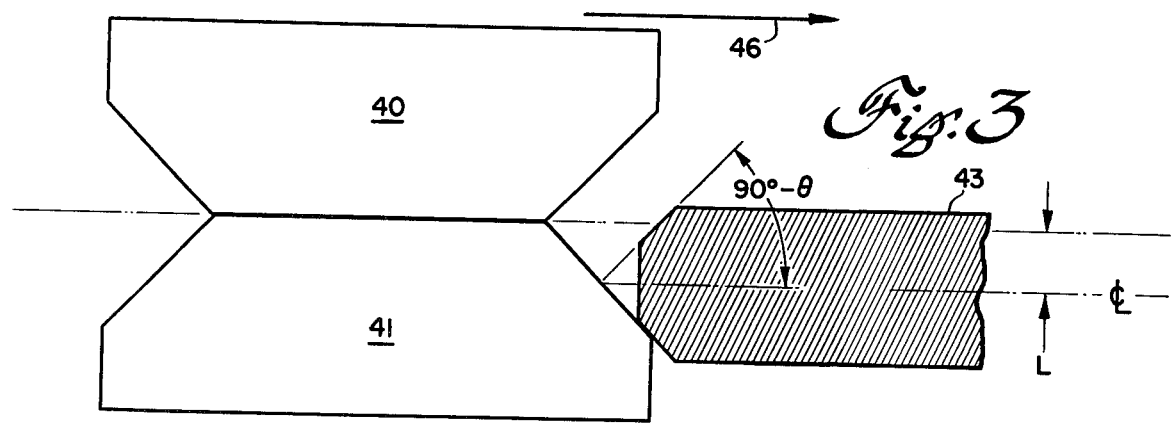
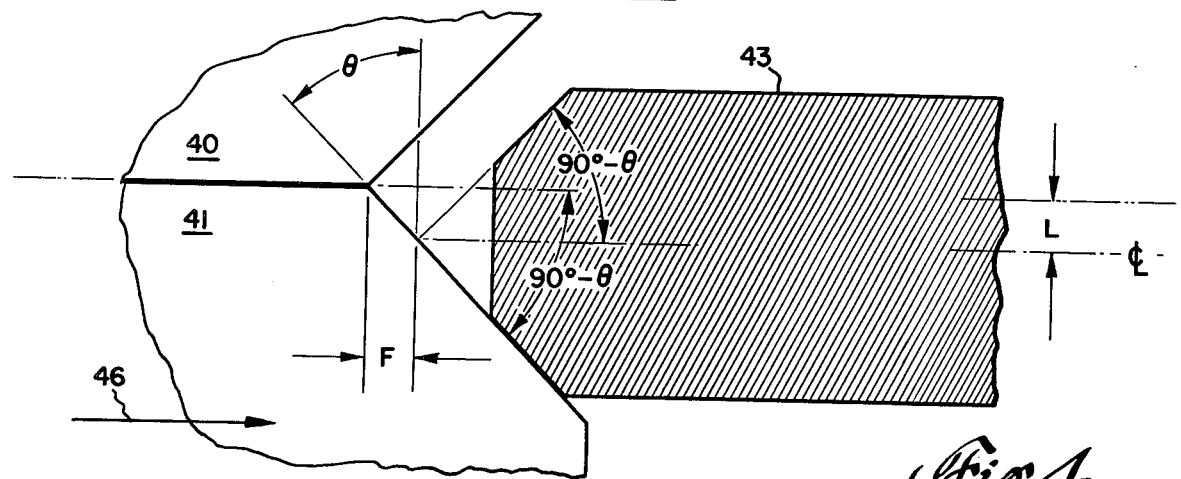
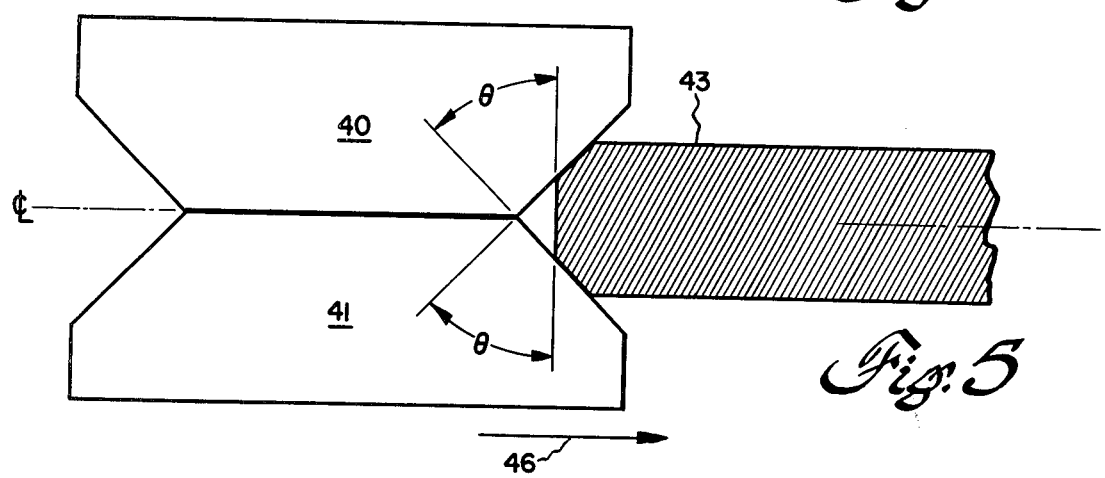
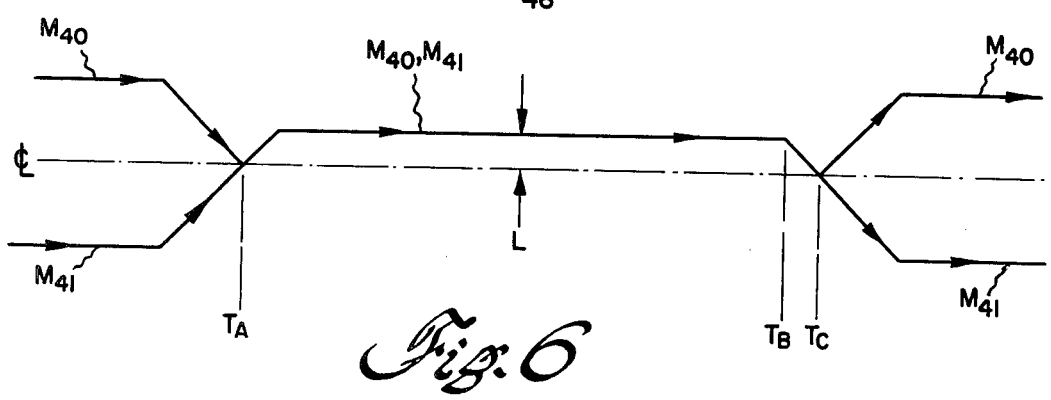

ACOUSTIC DIAGNOSTIC SYSTEM FOR CONTACTS IN POWER DISTRIBUTION SYSTEMS

BACKGROUND OF THE INVENTION

This invention relates to devices and methods for the analysis of acoustic signals generated by the electrical contact in high energy power distribution equipment. In particular, this invention relates to a system and method for detecting the misalignment of electrical contacts in power line voltage regulators.

A power line voltage regulator is an electrical device which acts to effect changes in the voltage in an electrical power distribution system in response to changes in electrical load upon the power distribution system. Typically, these voltage regulators switch power at levels of approximately several hundred amperes and over ten thousand volts. These devices, however, do not change the voltage on the line in response to minor variations in the load. Because of the energy levels being switched by this device, the contacts used in the actual switching must be moved very rapidly and with a certain amount of precision. Because of these requirements, the devices typically do not have motor driven actuators for the electrical contacts but rather they are typically driven by a spring wound mechanism which takes approximately five seconds to wind. However, the actual switching occurs in approximately 0.03 seconds. From this fact, an appreciation of the time scale on which a typical voltage regulator operates may be gained. The presence of this motor driven spring wound mechanism is significant because it, it and of itself, produces acoustic signals which must be considered in any acoustic analysis of the device.

These voltage regulators are designed to work in the field for a period of between ten and twenty years before failure or replacement. Therefore, over the life of a typical device, a very large number of switching operations occur. Typically, the switching action in these devices occurs by means of two finger-like contacts or blades which slide off, one contacting shelf onto another contacting shelf. If these fingers are misaligned, either with respect to one another or with respect to the shelves, excessive wear and stress occurs on those structures which support the finger-like contacts. These voltage regulator units are typically sealed units in which the internal mechanism is contained in a special oil. Prior to the invention herein, the only way to detect misalignment of these contacts was to remove the unit from service and disassemble it for inspection. This in itself is not only costly but care must be taken upon reassembly to insure that all gases have been removed from the oil and the container holding the oil and the internal mechanism. Failure to replace a unit which has misaligned switching contacts (or blades) can result in a catastrophic failure of the unit in the field, thereby posing a threat to property and personnel who may be present in the switch yard where the voltage regulator is typically installed.

Thus, the basic problem exists of how to detect this misalignment without disassembly and without removal of the unit from service for longer than approximately 5 minutes.

SUMMARY OF THE INVENTION

It has been observed that relatively high frequency acoustic signals with a well defined envelope structure are generated by electrical contacts as connections are made and broken in high energy switching applications. In accordance with one embodiment of the invention, a system for detecting misalignment of these contacts is disclosed, which system utilizes these high frequency acoustic signals to generate waveforms from which relative timing information can readily be gleaned. In particular, the acoustic signal is amplified and passed through a high pass filter which preserves the relatively high frequency content of the signal generated by the contacts, while at the same time rejecting that part of the acoustic signal resulting from other acoustic sources such as the windup spring mechanism. This signal is then rectified and passed through a low pass filter resulting in a signal which is recorded for either human or computer analysis to determine relative timing information for the motion of the electrical contacts. While this invention is described in particular in relation to voltage regulators, it is applicable to any high energy electrical switching system which produces a characteristic acoustic output as a result of the electromechanical action of the moving contacts.

DESCRIPTION OF THE DRAWINGS

FIG. 3 is a side elevation view illustrating the effect of lateral misalignment.

FIG. 4 is an enlarged view of a portion of FIG. 3.

FIG. 5 is a side elevation view illustrating the point in time at which both contacts are in contact with the second shelf.

FIG. 6 is an illustration of the relative motion of the two contacts.

DESCRIPTION OF THE INVENTION

Figure 1:
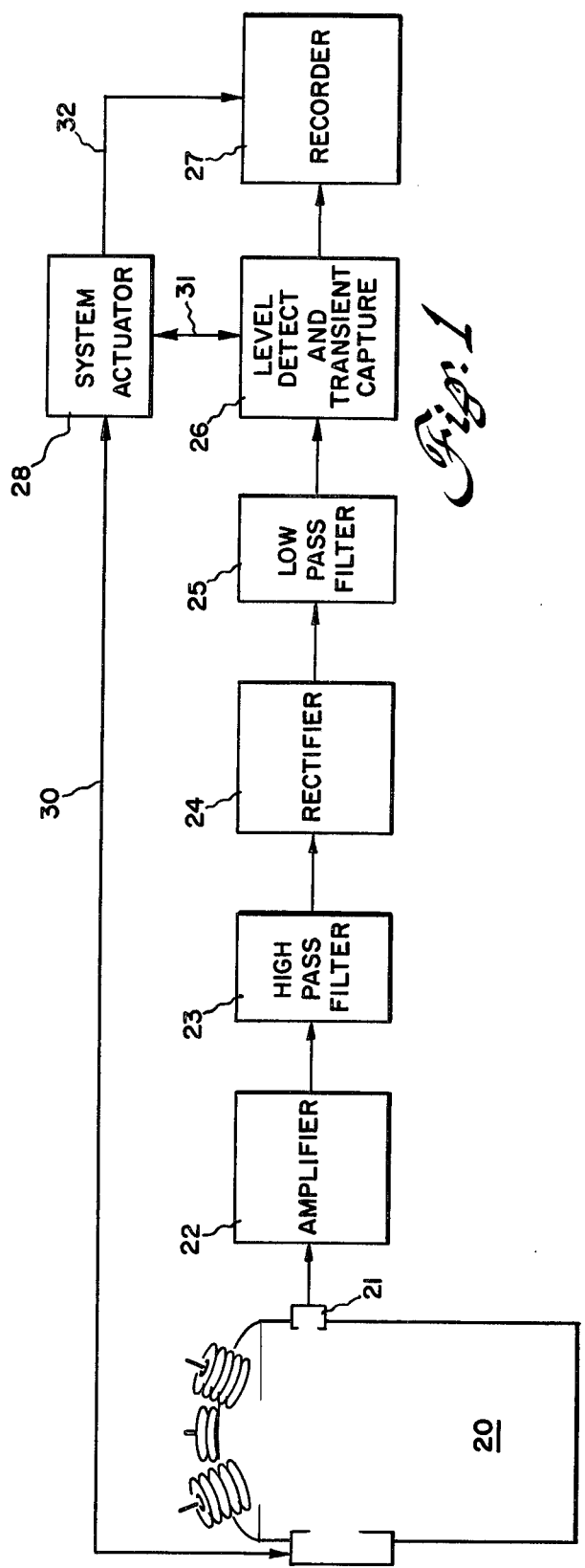
FIG. 1 is a block diagram illustrating one embodiment of the present invention.

FIG. 1 illustrates one embodiment of the present invention. In this embodiment, voltage regulator (or other electromechanical switching device) 20 has an acoustic transducer 21 attached to it externally. These acoustic signals generated by the voltage regulator 20 are fed into optional amplifier 22 and thence to a high pass filter 23. The high pass filter preserves the high frequency content of the acoustic signal and at the same time rejects lower range acoustic signals resulting from such mechanical operations as produced by the motor, gear, and spring windup in the voltage regulator 20. This filtered signal is then applied to rectifier 24 and thence to low pass filter 25. The demodulation accomplished by the rectifier 24 and low pass filter 25 provide for a transient signal which clearly shows the envelope of the high frequency acoustic signal generated when electrical contacts in voltage regulator 20 are made and broken. The demodulation also permits the resulting signal to be more easily recorded by recorder 27.

In a typical test conducted by the system disclosed herein, the voltage regulator 20 is removed from service for approximately 5 minutes so that the optional system actuator 28 can operate the switching contacts of the regulator over their complete range of contact changes. The acoustic transducer 21 is preferably attached to the exterior of the wall by a magnetic clamp since this affords a rapid but temporary installation. However, other mechanical attachments may be employed. Acoustic data is available to system elements 21, 22, 23, 24, and 25. The regulator is then placed in a neutral position and the system actuator 28 start button is depressed causing the indexing of the voltage regulator contacts through their cycle and causing the recording of the processed acoustic data for all tap changes. When the contacts 40, 41 slide off first shelf 42 (FIG. 2), they snap together producing an initial acoustic timing reference signal. When the contacts 40, 41 impact second shelf 43, one or two additional acoustic signals result depending on contact alignment. Level detector and transient capture circuit 26 (such as that supplied by Biomation, Inc., of Cupertino, Cal.) senses the increased level of the processed signals and then causes the system actuator 28 to temporarily shut off the windup motor in the voltage regulator 20. The system actuator 28 then also signals recorder 27 to record the transient. In a typical system, the recorder 27 is relatively slow at data capture compared to the transient capture mechanism of device 26. For this reason, system actuator 28 waits a relatively long time before receiving signals that the recorder 27 has completed the data transfer. Following this, the system actuator 28 resets the transient capture and level detect circuit 26 and signals the regulator to move to the next tap change. After the voltage regulator 20 has sequenced (indexed) through all tap changes the regulator is restored to service.

A more detail description of the individual components of the system is given below so that now a more detail description of the source of the problem may be considered.

Figure 2:
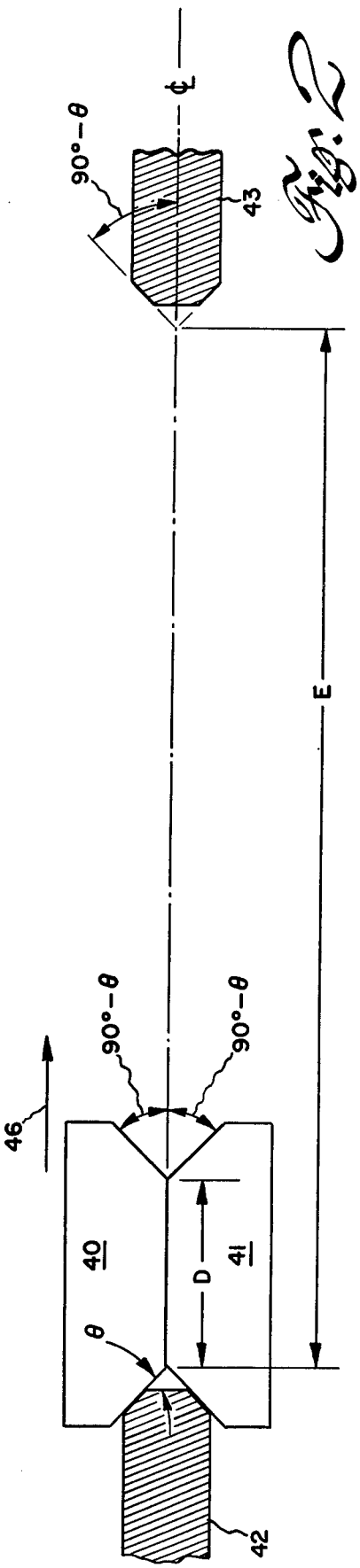
FIG. 2 is a side elevation view illustrating the normal motion of the electrical contacts and the conductive shelves between which the contacts are moved.

FIG. 2 illustrates the mechanism contained within voltage regultor 20, particularly, the arrangement of contact blades 40 and 41 and the shelves 42 and 43 between which the contacts move. While only two shelves and two contacts are shown, a typical voltage regulator has a plurality of these shelves and contacts. The shelves 42 and 43 are typically made of copper with the tips of the shelves coated with an Arconite ® coating to prevent wear of the copper surfaces due to electrical arcing. FIG. 2 also shows upper contact or switch blade 40 and lower contact or switch blade 41. These contacts are the finger-like members discussed above. Originally, these contacts 40 and 41 are separated, each contacting one side of the conducting element on shelf 42 with the shelf disposed between the contacts. The contacts move to the right as shown by motion arrow 46. FIG. 2 illustrates the case in which the contacts 40 and 41 have just slid off the shelf 42 just immediately prior to breaking contact. FIG. 2 also illustrates the case of ideal alignment in which the contacts are aligned with one another and also with the first and second shelves.

Also shown in FIG. 2 are certain distance and angle measurements which are useful in describing the transit and transit times between shelves. In particular, D is the width of the contact face. E is a measure of the distance between the shelves but E is measured not from the ends of the shelves but rather from the points at which the beveled edges of the shelves as extended meet as is shown in FIG. 2. Also shown is an angle $\theta$ which the front end of the shelf makes with the beveled edge of the contracts; put another way, the shelves and the contacts are each beveled at an angle of $90°-\theta$.

FIG. 3 illustrates the situation in which the contacts are misaligned with respect to the shelves and in particular it illustrates the point in time at which misaligned contacts first connect with the second shelf 43. Because of the misalignment distance L, contact 41 makes connection with shelf 43 first and thereafter at a later time, contact 40 makes contact with the second shelf 43. This misalignment creates a great amount of stress in the insulating supports for finger-like contacts 40 and 41 because of the rapidity with which they move.

FIG. 4 is an enlarged illustration of a portion of FIG. 3 showing in greater detail the distance by which the lower contact 41 arrives early at second shelf 43. In particular, this distance is shown as F in FIG. 4. It is noted here that F and L are related and in particular $F = L \tan \theta$.

FIG. 5 illustrates either the case of ideal alignment at the point when both contact 40 and 41 simultaneously connect with the second shelf 43 or the situation in which misaligned contacts have subsequently moved so that the second contact 40 just connects with the second shelf 43. Here the fixed shelf 43 has effected a certain degree of realignment but not without having induced stress in the contact support members due to the misalignment.

FIG. 6 is a diagrammatic view illustrating the relative motion of the two contacts. Contact 40 traverses the path illustrated by motion line $M_{40}$ and contact 41 transverses the path illustrated by motion line $M_{41}$. Ideally, these contacts should traverse a path along the center line between the two shelves 42 and 43, but as shown the contacts are laterally misaligned by an amount L. Also shown in FIG. 6 are times $T_A$, $T_B$, and $T_C$, which play a key role in calculating an index of misalignment for the device. $T_A$ is the time at which contact is broken between contacts 40 and 41 and shelf 43. This is a reference point in time and it is also the point in time at which the high frequency acoustic signals appear as the result of the sudden impact between the shelf 42 and contacts 40 and 41. $T_B$ is the point in time at which the first contact connects with the second shelf 43. In the illustration, the lower contact 41 is shown as the contact which first connects with the second shelf; however, it can be appreciated that if the lateral misalignment is in the other direction then contact 40 is the first contact to connect with the second shelf 43. $T_C$ is the point in time at which the second contact connects with the second shelf (the situation shown in FIG. 5). Ideally, L should be zero and therefore $T_B$ should be equal to $T_C$. However, misalignment does occur and these time instances are used to define an index of misalignment I as follows:

$$I = \frac{T_C - T_B}{T_C - T_A}.$$

Ideally, I should be zero for the case of no misalignment when L is equal to zero and $T_C$ is equal to $T_B$. Certainly, the index of misalignment can be no greater than 1.

The index of misalignment is also expressable in terms of the misalignment and the physical dimensions of the mechanism. Assuming a substantially constant rate of movement for the contacts between shelves, the time interval $T_C - T_A$ is proportional to E-D (shown in FIG. 2). Put algebraically, this means $T_C - T_A = K(E - D)$.

Likewise, $T_C-T_B$ is also proportional to the distance travelled during this interval, assuming a substantially constant velocity during the interval. In particular, $T_C-T_B=K'F=K'L \tan \theta$. Combining the expressions for these two intervals, the index of misalignment is expressed in terms L, $\theta$, E, and D:

$$I=(K'/K)(L \tan \theta)/(E-D).$$

Thus, it is seen that the index of misalignment is directly proportional to the amount of the misalignment.

Figure 7:
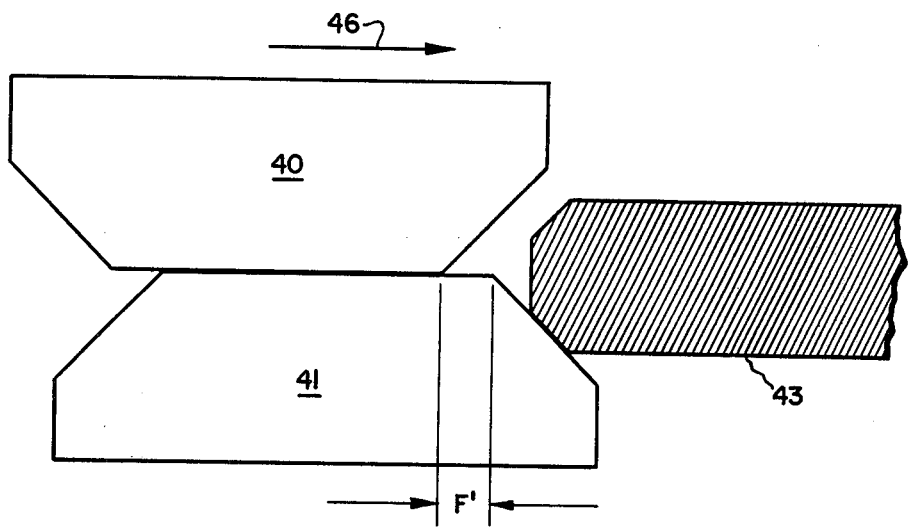
FIG. 7 is a side elevation view illustrating the effect of a second form of contact misalignment.

FIG. 7 illustrates a case of a different form of misalignment. The misalignment discussed above in FIGS. 2 and 6 refer only to the lateral misalignment of the contacts. In addition, the contacts may be misaligned as shown in FIG. 7 by an amount F'. This form of misalignment also produces unwarranted stress due to non-simultaneous contacting with the second shelf 43. Similar to the above-described situation high frequency acoustic noise pulses are produced upon each separate contacting of the contacts 40 and 41 with the second shelf 43. The fact that the misalignment is of a different form does not affect this aspect of the problem or the system designed to detect this problem.

Figure 8:
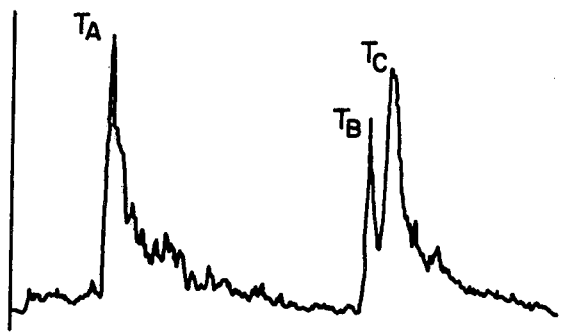
FIG. 8 is a sample waveform output from the system illustrating the situation of small range misalignment.
Figure 9:
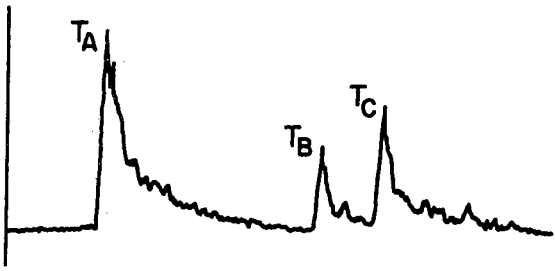
FIG. 9 is the same as FIG. 8 for the case of mid-range misalignment.
Figure 10:
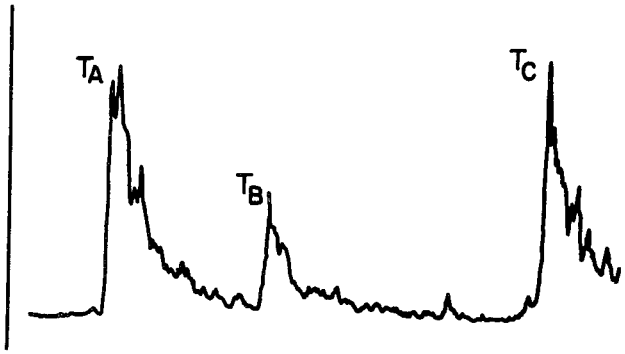
FIG. 10 is the same as FIG. 8 but illustrating the case of large scale misalignment.

FIGS. 8, 9, and 10 are samples of signal output by the system disclosed herein for varying degrees of lateral misalignment. For example, FIG. 9 illustrates the case of small misalignment (approximately 0.03 inches). Also shown on this figure and FIGS. 9 and 10 are the times $T_A$, $T_B$, and $T_C$ as described above. From these figures, it can be appreciated that the index of misalignment is a good figure of merit for determining the internal status of the contacts without disassembly. FIG. 9 illustrates the case of a mid-range value of misalignment (approximately 0.13 inches) and as can be seen in FIG. 7, the peak corresponding to the time at which the first finger contacts the second shelf is farther removed from the time at which the second contact finger connects with the second shelf. FIG. 10 illustrates the case of large misalignment (approximately 0.23 inches) in which the contacts and shelves are almost stubbing one another. Note too here that this large scale misalignment results in a greater value of $T_C-T_A$, indicating that a large amount of kinetic energy imparted to the contact by the spring mechanism is dissipated in the near collision between the first finger to contact the second shelf and the second shelf itself at time $T_B$.

As indicated above, a more detailed description of the elements in the system shown in FIG. 1 is provided.

The acoustic transducer used in the system disclosed herein is preferably of the accelerometer type which better enables it to detect the high frequency acoustic signals generated by the make and break impact of the electrical contacts within the voltage regulator 20. Acoustic transducer 21 may comprise other standard microphonic type transducers but the accelerometer type is preferred.

Amplifier 22 is optional and it is used to boost the signal from the transducer 21 to an acceptable level. If an amplifier were not provided to do this, an appropriate amplifier could be incorporated in the recorder 26.

The high pass filter 23 receives signals from the amplifier 22 or directly from the acoustic transducer 21. The high pass filter functions to preserve the high frequency content of the acoustic signal generated by the contacts within voltage regulator 20 and at the same time rejects a portion of the acoustic signal generated by extraneous sources such as the spring winding mechanism which generates acoustic signals in the 5 to 6 kilohertz frequency range. The high pass filter typically has a frequency cutoff of approximately 10 kilohertz for the application described above. While this frequency cutoff is preferred, workable cut-off frequencies in the range between 8 and 12 kilohertz are also usable. In applications other than the one particularly described herein, the actual choice of cut-off frequency for the high pass filter is selectable depending upon the acoustics of the system involved. The high pass filter itself may either be an active filter or a passive filter. In particular, in one embodiment of the present invention, the high pass filter means are provided by a four-pole active filter, the active element being provided by an operational amplifier.

The rectifier 24 receives the signal from the high pass filter 23 and may itself be either an active or passive device. In a preferred embodiment of the invention, the rectifier means comprise a full wave rectifier which preserves the energy content of the signal and at the same time better defines the acoustic decay envelope.

The resulting signal from the rectifier is provided as an input to a low pass filter which serves to remove the rapid variations due to the high frequency acoustic signal while at the same time preserving the lower frequency envelope of the signal from which the relevant timing information is obtained. The low pass filter has a preferred frequency cutoff of approximately 5 kilohertz for the application described herein related to voltage regulators. However, a cut-off frequency between approximately 1 and approximately 7 kilohertz is usable. For other applications, the cut-off frequency of the low pass filter is selected to permit passage of the lower frequency signal containing information about the envelope of the high frequency component. It can thus be said that in this sense the high frequency acoustic signal generated by the contacts acts as a carrier signal which is modulated by the movement of the contacts toward and away from the shelves. In this sense the low pass filter is selected to remove this acoustic carrier signal. Again, the low pass filter may either be an active or a passive device. An active four-pole filter with an operational amplifier comprising the active element is a preferred form of this element.

The output of the low pass filter 25 provides the input for level detect and transient capture circuit 26. As discussed above, such a circuit is provided commercially by Biomation, Inc. This circuit monitors the output signal level of the low pass filter 25 and starts capturing the output when it reaches a sufficient level. The capture circuit 26 is capable of receiving information at a relatively high rate as compared with the recorder 27. It is also capable of supplying the captured information at a rate comparable to the rate at which the recorder 27 operates.

The captured output of the low pass filter is recorded by recorder 27. This recorder may either be a strip chart type recorder or a magnetic recording system. A strip chart recorder has the advantage of producing signals in a form which are immediately readable by a human observer. In this connection, the low pass filter also serves to filter out confusing high frequency components of the acoustic signal and produces graphs which are very easily read. If the recorder means 27 is a form of magnetic or other recording system, there is the advantage that the data is readily processable by computers, taking data perhaps from several different locations. The kinds of signals to be recorded are typically shown in FIGS. 8, 9, and 10.

It is only necessary to activate the recording and detection system for the time just immediately before the contact fingers leave the first shelf to just immediately after both contact fingers have arrived at the second shelf. For this reason, the optional system actuator 28 is provided which is triggered by level detector 26 upon receiving a signal from low pass filter 25. The system actuator then provides the timing and the control signals to activate the recorder and to sequence the voltage regulator through its tap changes. This is accomplished through control lines 30, 31, and 32 as shown.

From the above, it can be appreciated that the invention disclosed herein provides a novel apparatus and method for detecting the condition of switching contacts in power distribution equipment when such contacts are otherwise inaccessible other than by expensive and disruptive disassembly. The system may be installed permanently in the field or it may be provided as a portable unit for routine monitoring performed in accordance with the scheduled testing of other components. The system is used to detect faulty equipment and to determine the projected life of the equipment. The system disclosed herein thereby reduces the risk of catostrophic equipment failure and the potential hazards that failure presents to both property and to personnel.

While this invention has been described with the reference to particular embodiments and examples, other modifications will occur to those skilled in the art in view of the above teachings. Accordingly, it should be understood that within the scope of the appended claims, the invention may be practiced otherwise than is specifically described.

The invention claimed is:

1. An acoustic diagnostic system for determining timing information related to the making and breaking of switch blade contacts comprising:

transducer means to detect acoustic signals generated by the contacting operation of said switch blades;
   high pass filter means receiving the signals generated by the transducer means;
   rectifier means receiving the signal generated by the high pass filter means;
   low pass filter means with frequency cutoff below that of the high pass filter means, said low pass filter receiving the signals generated by the rectifier means; and
   means to record the output of said low pass filter means, whereby misalignment in said switch blades may be detected.

2. The acoustic diagnostic system in claim 1 in which the transducer means is an accelerometer.

3. The acoustic diagnostic system of claim 1 in which the high pass filter means has a cut-off frequency of approximately 10 kilohertz.

4. The acoustic diagnostic system of claim 1 in which the high pass filter means has a cut-off frequency of between approximately 8 and approximately 12 kilohertz.

5. The acoustic diagnostic system of claim 1 in which the low pass filter means has a cut-off frequency of approximately 5 kilohertz.

6. The acoustic diagnostic system of claim 1 in which the low pass filter means has a cut-off frequency of between approximately 1 kilohertz and approximately 7 kilohertz.

7. The acoustic diagnostic system of claim 1 in which the rectifier means comprise a full wave rectifier.

8. The acoustic diagnostic system of claim 1 in which said recording means comprises a strip chart recorder.

9. The acoustic diagnostic system of claim 1 in which the recording means operate to place the low pass filter output on a magnetic medium.

10. The acoustic diagnostic system of claim 1 further comprising:
    means to actuate said system substantially only for the duration of said acoustic signals.

11. The acoustic diagnostic system of claim 1 further comprising:
    amplifier means accepting signals generated by said transducer means and outputing an amplified signal to said hgih pass filter means.

12. A method for determining misalignment of switch blade contacts, said contacts being characterized by the generation of acoustic signals upon the making and breaking of contact, said method comprising the steps of:

A. converting said acoustic signals to electrical signals;
    B. passing said electrical signals generated in step A through a high pass filter means;
    C. rectifying the signal generated in step B;
    D. passing the rectified singal generated in step C through low pass filter means; and
    E. analyzing the signal output from said low pass filter means in step D to compute an index of misalignment, I, in accordance with the formula $I==(T_C-T_B)/(T_C-T_A)$, where $T_A$ is the time at which a first pulse burst occurs, $T_B$ is the time at which a second pulse burst occurs, and $T_C$ is a time at which a third pulse burst occurs.

* * * * *